United States Patent [19]
Rudi

[11] Patent Number: 6,098,281
[45] Date of Patent: Aug. 8, 2000

[54] ELECTRICAL PINS AND METHOD FOR THEIR INSERTION INTO APERTURES OF A CIRCUIT BOARD

[75] Inventor: Kolb Rudi, Füssen-Hopfen, Germany

[73] Assignee: Weidmüller Interface GmbH & Co., Detmold, Germany

[21] Appl. No.: 08/938,405

[22] Filed: Sep. 26, 1997

[30] Foreign Application Priority Data

Nov. 6, 1996 [DE] Germany .......................... 196 45 704

[51] Int. Cl.[7] ................................................. H01R 9/00
[52] U.S. Cl. ................................. 29/845; 29/845; 29/844; 29/843; 29/841; 29/839; 29/837; 439/82
[58] Field of Search ........................... 29/839, 840, 843, 29/844, 845; 174/94 R; 439/751, 82, 873

[56] References Cited

U.S. PATENT DOCUMENTS

| | | |
|---|---|---|
| 4,753,602 | 6/1988 | Peyrat et al. . |
| 4,867,710 | 9/1989 | Harting et al. .......................... 439/751 |
| 4,878,861 | 11/1989 | Kendall et al. ......................... 439/751 |
| 4,906,209 | 3/1990 | Tanabe et al. .......................... 439/620 |
| 5,487,684 | 1/1996 | Schalk et al. ........................... 439/751 |
| 5,738,550 | 4/1998 | Sakuraoka et al. ..................... 439/751 |

FOREIGN PATENT DOCUMENTS

| | | |
|---|---|---|
| 0059462 | 2/1982 | European Pat. Off. . |
| 0221092 | 3/1986 | European Pat. Off. . |
| 0552613 | 6/1992 | European Pat. Off. . |
| 20411383 | 12/1933 | Germany . |
| 3804041 | 2/1988 | Germany . |
| 3909310 | 3/1989 | Germany . |
| 22195836 | 9/1986 | United Kingdom . |

*Primary Examiner*—Lee Young
*Assistant Examiner*—Sean Smith
*Attorney, Agent, or Firm*—Notaro & Michalos P.C.

[57] ABSTRACT

Electrical pin (10) for solderless insertion into metallized apertures of circuit boards, comprising an elastically deformable press-fit portion (14) with four contact areas (26), which are located on a first larger diameter (28) as compared with the diameter of the apertures of the circuit boards. A positioning portion (18) is provided ahead of the press-fit portion (14) and a transition portion (16) lies therebetween. The positioning portion (18) also has four contact areas (36), which are located on a second diameter (30) slightly smaller than the diameter of the apertures. Contrary to the press-fit portion (14) the positioning portion (18) is not deformed during the insertion of the electrical pin (10). Due to the positioning portion (18) the electrical pins can be connected to the circuit board in two operation steps, the first one being the positioning step and the second one being the press-in step. Due to the positioning portion (18) the electrical pins are pre-positioned in the apertures one by one and are held non-tiltable in the apertures and, after having transported the circuit board to a second station, all pins are commonly pressed into the apertures by a simple press-in die.

7 Claims, 2 Drawing Sheets

ELECTRICAL PINS AND METHOD FOR THEIR INSERTION INTO APERTURES OF A CIRCUIT BOARD

BACKGROUND OF THE INVENTION

The invention relates to an electrical pin for solderless insertion into metallized apertures of a circuit board, comprising a shaft having a longitudinal axis and a tapered end, an elastically deformable press-fit portion provided at the shaft and spaced from the tapered end thereof, the press-fit portion comprising at least three contact areas extending substantially parallel with the axis of the shaft and over the whole length of the press-fit portion, said contact areas equally spaced from said axis and defining a first diameter larger than a diameter of each one of said apertures in the circuit board, and a transition portion provided at the shaft and connected to the press-fit portion in an inserting direction, the transition portion also comprising contact areas connected to those of the press-fit portion, tapering in inserting direction and spaced from the tapered end of the shaft.

An electrical pin of this kind is known from DE-3909310-A1. Valleys are formed in the press-fit portion and in the transition portion whereby a pair of webs are formed connected by a bridge. At the outer edges of both webs contact areas are formed, which during the inserting step of the pin into an aperture of the circuit board are elastically pressed against the inner surface of the aperture.

A similar art is known from DE-3804041-A1, which teaches that by the transition portion a soft insertion of the pin into the aperture of the circuit board is achieved. A leading portion having a square or cylindrical cross-section which is remarkably less than the aperture of the circuit board is arranged between the transition portion and the tapered end of the pin.

European Patents 0059462, 0221092 and U.S. Pat. No. 3,837,063 show pins of a similar construction.

To install a circuit board with such electrical pins automatically, the pins must be relieved from a carrier strip, then aligned with the aperture and pressed into the latter. However, in high speed insertion machines problems arise due to the precise alignment of each pin with respect to the predetermined aperture. During a first positioning step the pin must be restrictively guided. Then, when entering the aperture the pin must be released in order to enable self-alignment. Thereafter the pin is engaged again by a pressing tool to press it into the aperture. Because the pins are handled one by one, the operating speed of the machine is limited.

BRIEF SUMMARY OF THE INVENTION

One object of the invention is to provide an electrical pin of the kind mentioned at the beginning which avoids the problems listed before. Another object is to provide an electrical pin which allows a two-step-method for positioning the pin and for pressing-in a plurality of pins commonly. One further object is to provide an electrical pin as described in the leading paragraph of the description which is characterized in that a positioning portion is provided at the shaft between the transition portion and the tapered end of the shaft, the positioning portion also comprises contact areas running at least substantially parallel with the shaft axis and defining a second diameter smaller than the first diameter, the second diameter in observing a clearance for displacement is equal with the diameter of the apertures in the circuit board.

Thanks to the invention a plurality of electrical pins can be easily positioned in the apertures of the circuit board one by one in a first positioning step in which the pins slide into apertures and thanks to their positioning portions are held coaxially within their apertures and at right angles to the circuit board. This would not be achieved with the known pins because the shafts thereof have a diameter much smaller than that of the apertures in the circuit board. The circuit board is then moved to a pressing tool which presses all pre-positioned pins or a group of such pins in a common pressing step deeper into the apertures. By this pressing step the pins need not be firmly gripped but can be contacted by a flat pressing surface at their ends so that no deformations of the pins can occur.

According to a further feature of the invention the length of the positioning portion is substantially the same as that of the press-fit portion and therefore corresponds to the thickness of the circuit board. Thus the electrical pins are guided over the whole depth of the apertures of the circuit board. The tapered end of the shaft facilitates self-aligning during the positioning step.

According to a preferred embodiment the press-fit portion is composed of a pair of webs and a curved thin bridge therebetween forming an H-shaped figure, each web having a pair of rounded outer edges, said outer edges forming said contact areas of the press-fit portion, wherein the positioning portion also is composed of a pair of webs and a connecting bridge therebetween, wherein the press-fit portion and the positioning portion are of different cross-sections, wherein the webs of the positioning portion have rounded outer edges of an equal radius of curvature and wherein said radius of curvature is greater than that one of the outer edges of the webs of the press-fit portion. The radii of the rounded outer edges of the press-fit portion are smaller than the radius of the aperture of the circuit board, hence the contact areas substantially are contact lines.

According to an advantageous feature each contact area of the press-fit portion forms a point of contact with a circle of the first diameter and diagonal lines connecting diagonally opposed points of contact respectively intersect one another in a central axial plane at a first point of intersection and wherein corresponding diagonals of the press-fit portion intersect one another in said central axial plane at a second point of intersection, and wherein both points of intersection are spaced from one another.

An important further feature of the invention lies in that, that the contact areas of the press-fit portion, the transition portion, the positioning portion and the tapered end are continuously associated with one another. To achieve this a first valley is formed at each side of the bridge of the press-fit portion and a second valley is formed at each side of the connecting bridge of the positioning portion and wherein the first valleys are wider than the second valleys and wherein the connecting bridge at the positioning portion is shorter than the bridge of the press-fit portion.

The invention further relates to a method for mounting electrical pins on circuit boards, wherein in a first step a plurality of electrical pins are slidingly inserted with their positioning portions into predetermined apertures of a circuit board by means of an inserting tool and after having displaced one of the items comprising the inserting tool and the circuit board, the electrical pins in a second step are commonly pressed deeper into the apertures by a pressing tool until their press-fit portions are received in the apertures.

DETAILED DESCRIPTION

Figure 1:
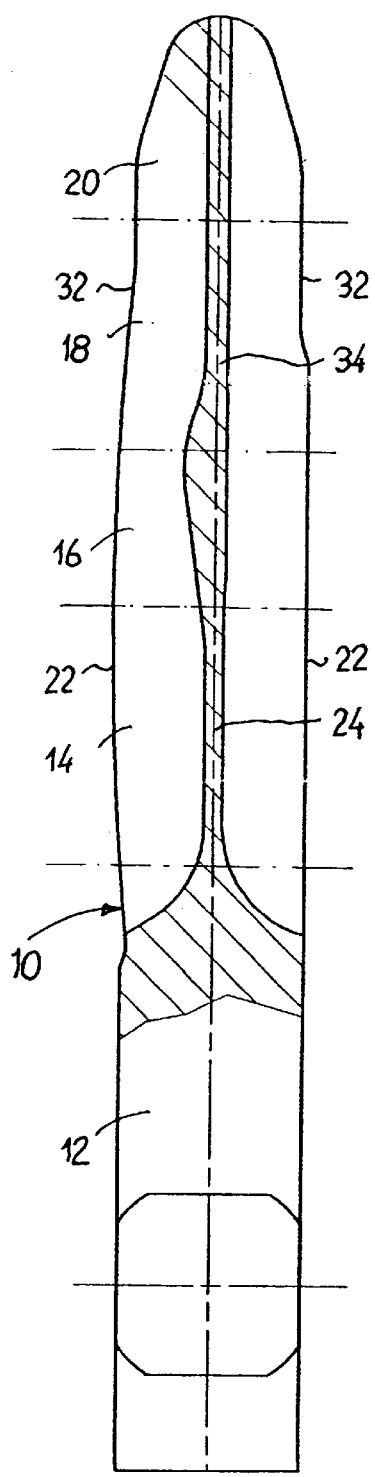
FIG. 1 shows a side view of the new electrical pin partly in cross-section.
Figure 2:
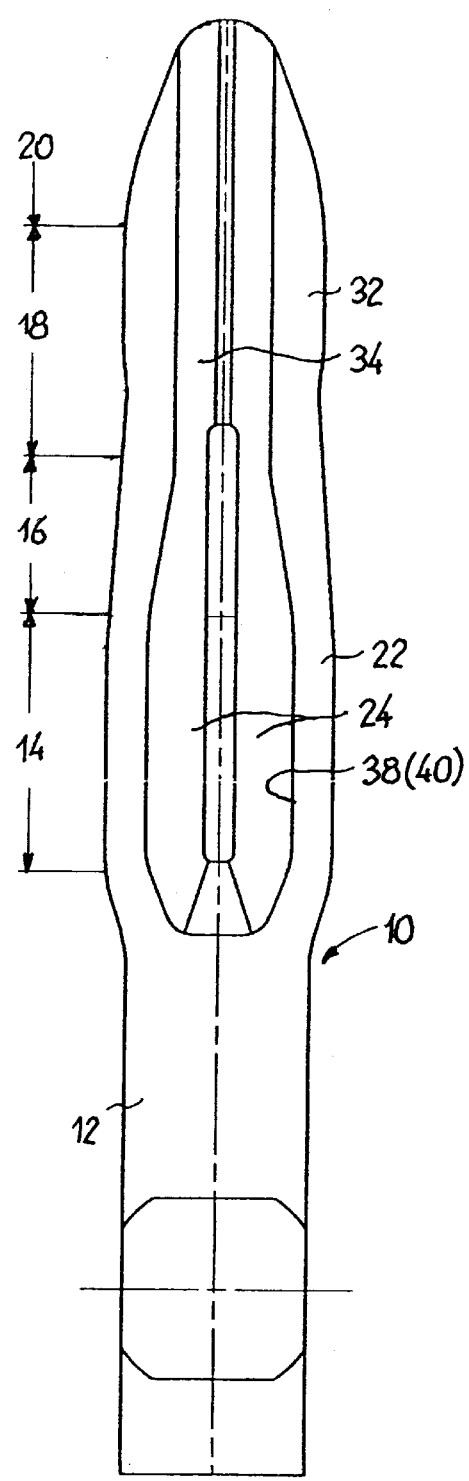
FIG. 2 shows a plan view of the electrical pin according to FIG. 1.

An electrical pin 10 with a shaft 12 of octagonal cross-section has a press-fit portion 14, a slightly tapering transition portion 16 followed by a positioning portion 18 and a tapered end 20. The press-fit portion is formed by a pair of webs 22 and a bridge 24 connecting these webs. The bridge is thin-walled and extends along a circular arc and forms spring-elastic means, due to which both webs 22 are narrowed whilst the electrical pin is pressed into an aperture of a circuit board; due to this the contact areas 26 formed by the outer edges of the webs are displaced that way, that they decrease from a circle with a first diameter 28 to a circle with a second diameter 30, which corresponds to an inner diameter of an aperture of a cirucit board less a sliding clearance.

In the region of it's positioning portion 18 the electrical pin 10 also shows two webs 32 with a connecting bridge 34. The outer edges of the webs 32 are also rounded as well as those of the webs 22 and thus form four contact areas 36, which have a greater radius of curvature than the contact areas 26. The contact areas 36 are located on a circle, which corresponds to a circle with a second diameter 30 minus a small distance, so that contact areas 36 have a clearance space with circle 30 in which to slide. Webs 32 and bridge 34 are formed mirror-symmetrical to two orthogonal directions and the diagonals, which connect two diametrically opposed contact areas 36 meet in a point, which is identical with the centre point of the circles 28, 30. The webs 32 and the bridge 34 form an unelastic area, which fits into the aperture of the circuit board.

The transition portion 16 of the electrical pin 10 also shows a pair of webs connected by a respective bridge, wherein the rounded outer edges form contact areas, which connect the contact areas 26 and 36 continuously. Due to this construction there are formed valleys 38, 40 in the portions 14, 16, 18, which are boardered by the inclined flanks of the webs 22, 32 facing each other and the bridges 24, 34. In the positioning portion 18 the cross-section of the valleys is the smallest one and then enlarges up to the press-fit portion 14. The preferred embodiment also shows the valleys 38, 40 alongside the tapered end 20 to form continuous contact between the web formations and the positioning portion 18.

Figure 3:
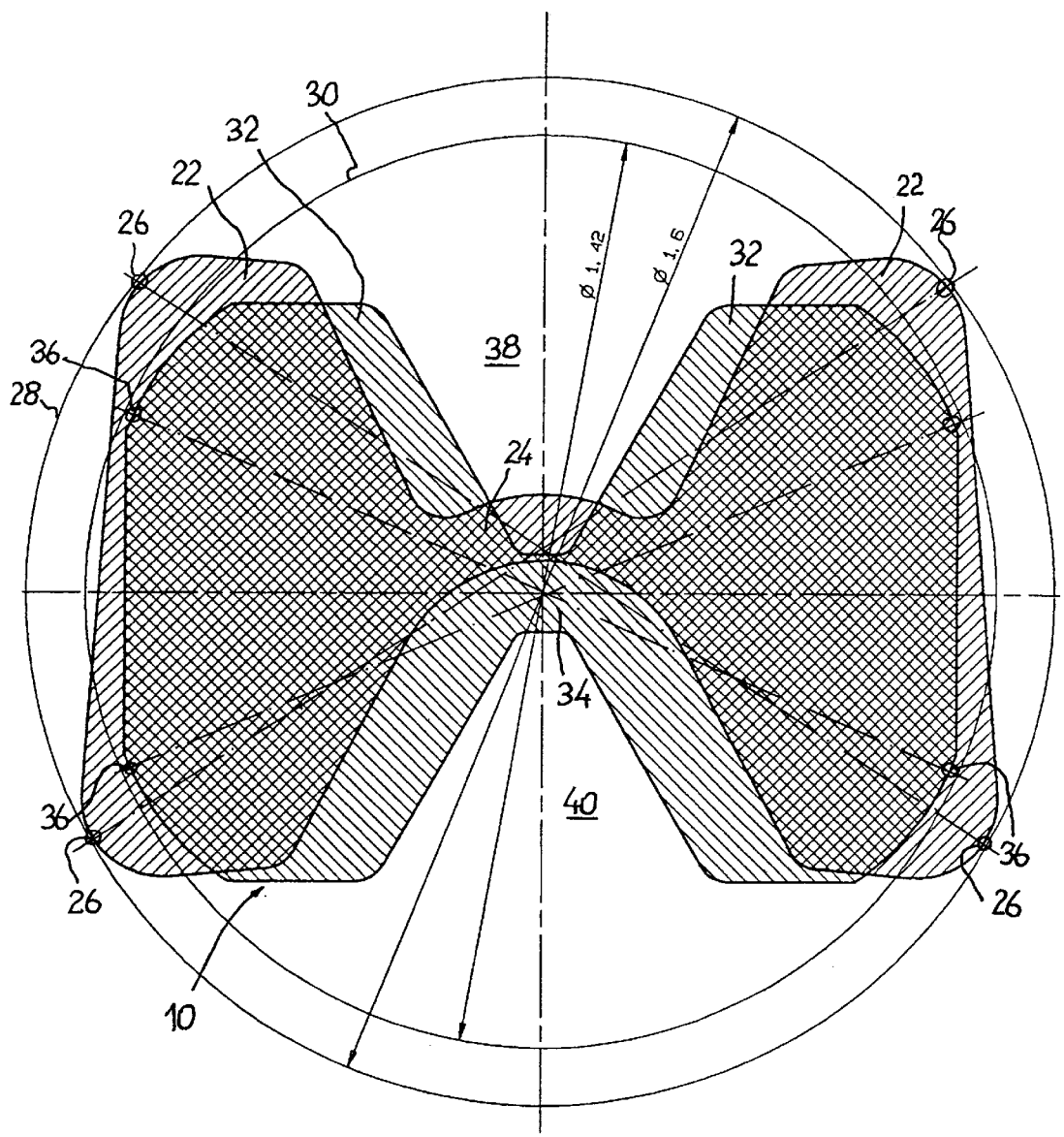
FIG. 3 shows a view composed of two superimposed radial cross-sections, the first one showing the press-fit portion and the second one showing the positioning portion.

As shown in FIG. 3 the second circle 30 has a diameter of 1.42 mm, whereas the first circle 28 for the contact areas 26 of the press-fit portion 14 has a diameter of 1.6 mm. This results in a radial inwards deformation of the contact areas 26 of 0.09 mm during the pressing operation in the press-fit portion 14.

An essential feature of the invention lies in the positioning portion 18 having nearly the same length as the press-fit portion 14. This ensures that the electrical pin protrudes the aperture of the circuit board completely by it's positioning portion 18, hence even shaking motions cannot arise tilting or hanging loose of the electrical pins in the apertures of the circuit board.

What is claimed is:

1. An electrical pin for solderless insertion into metallized apertures of a circuit board, the pin comprising an elastically deformable press-fit portion, a transition portion connected to the press-fit portion and a positioning portion connected between the transition portion and a tapered end, wherein each of the press-fit portion, transition portion and positioning portion each comprises at least three peripherally spaced contact areas extending substantially along the entire length of the respective portion and being equidistantly spaced from a common longitudinal axis, the contact areas of the press-fit portion being equidistantly spaced from the common longitudinal axis and defining a first diameter which is larger than a diameter of the apertures in the circuit board, the contact areas of the transition portion tapering in a direction toward the positioning portion, and the contact areas of the positioning portion being equidistantly spaced from the common longitudinal axis and defining a second diameter that is smaller than the first diameter, the second diameter being equal to an aperture diameter of the apertures on the circuit board minus a small distance for clearance of the contact areas with sides of the apertures, the press-fit portion comprising a pair of webs and a curved, thin bridge between the pair of webs forming an H-shaped figure, each web having a pair of first rounded outer edges, the first rounded outer edges forming the contact areas of the press-fit portion and the positioning portion comprising a second pair of webs and a connecting bridge between the second pair of webs, the press-fit portion and positioning portion having different cross-sectional shapes.

2. An electrical pin according to claim 1, wherein the second pair of webs having second rounded outer edges each with the same second radius of curvature that is greater than a first radius of curvature of the first rounded outer edges.

3. An electrical pin according to claim 1, wherein each contact area of the press-fit portion forms a point of contact with a circle having the first diameter and at least a pair of diagonal lines connecting diagonally opposed points of contact intersect each other in a central axial plane at a first point of intersection, wherein a corresponding at least one pair of diagonals of the positioning portion intersect each other in the central axial plane at a second point of intersection, the first and second points of intersection being spaced apart from each other.

4. An electrical pin according to claim 3, wherien the second point of intersection substantially coincides with a center of a circle having the second diameter.

5. An electrical pin according to claim 3, wherein the central axial plane divides the press-fit portion and the positioning portion into symmetrical halves, respectively, and the central axial plane is situated at least substantially at right angles to the connecting bridge of the positioning portion.

6. An electrical pin according to claim 1, wherein the connecting bridge of the positioning portion is shorter than the curved, thin bridge of the press-fit portion.

7. An electrical pin according to claim 1, wherein a first valley is formed adjacent each side of the curved, thin bridge and a second valley is formed adjacent each side of the connecting bridge, the first valleys being wider than the second valleys.

* * * * *